United States Patent
Bleeker

(10) Patent No.: US 7,119,881 B2
(45) Date of Patent: *Oct. 10, 2006

(54) LITHOGRAPHIC APPARATUS AND DEVICE MANUFACTURING METHOD

(75) Inventor: Arno Jan Bleeker, Westerhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 11/316,617

(22) Filed: Dec. 21, 2005

(65) Prior Publication Data

US 2006/0098180 A1 May 11, 2006

Related U.S. Application Data

(63) Continuation of application No. 10/715,116, filed on Nov. 18, 2003, now Pat. No. 7,009,682.

(30) Foreign Application Priority Data

Nov. 18, 2002 (EP) .................................. 02257938

(51) Int. Cl.
  G03B 27/32 (2006.01)
  G03B 27/42 (2006.01)
(52) U.S. Cl. .......................................... 355/53; 355/77
(58) Field of Classification Search ................. 355/30, 355/53, 55, 72, 77, 75
  See application file for complete search history.

(56) References Cited

U.S. PATENT DOCUMENTS

| | | | |
|---|---|---|---|
| 3,573,975 A | 4/1971 | Dhaka et al. ................ 117/212 |
| 3,648,587 A | 3/1972 | Stevens .......................... 95/44 |
| 4,346,164 A | 8/1982 | Tabarelli et al. ............. 430/311 |
| 4,390,273 A | 6/1983 | Loebach et al. ............. 355/125 |
| 4,396,705 A | 8/1983 | Akeyama et al. ............ 430/326 |
| 4,480,910 A | 11/1984 | Takanashi et al. ............. 355/30 |
| 4,509,852 A | 4/1985 | Tabarelli et al. ............... 355/30 |
| 5,040,020 A | 8/1991 | Rauschenbach et al. ....... 355/53 |
| 5,121,256 A | 6/1992 | Corle et al. .................. 359/664 |
| 5,610,683 A | 3/1997 | Takahashi ...................... 355/53 |
| 5,715,039 A | 2/1998 | Fukuda et al. ................. 355/53 |
| 5,825,043 A | 10/1998 | Suwa .......................... 250/548 |
| 5,900,354 A | 5/1999 | Batchelder ................... 430/395 |
| 6,191,429 B1 | 2/2001 | Suwa .......................... 250/548 |
| 6,236,634 B1 | 5/2001 | Lee et al. .................... 369/112 |
| 6,560,032 B1 | 5/2003 | Hatano ........................ 359/656 |
| 6,600,547 B1 | 7/2003 | Watson et al. |
| 6,603,130 B1 | 8/2003 | Bisschops et al. ......... 250/492.1 |
| 6,633,365 B1 | 10/2003 | Suenaga ....................... 355/53 |

(Continued)

FOREIGN PATENT DOCUMENTS

DE  206 607  2/1984

(Continued)

OTHER PUBLICATIONS

EP Search Report for EP 02257938 dated Sep. 25, 2003.

(Continued)

*Primary Examiner*—Rodney Fuller
(74) *Attorney, Agent, or Firm*—Pillsbury Winthrop Shaw Pittman LLP

(57) ABSTRACT

In an immersion lithography apparatus, an isolator is provided between the substrate table and the projection system to, for example, prevent currents in the liquid exerting forces on the projection system that might tend to distort the reference frame to which said projection system is connected. The isolator may be maintained still relative to the reference frame by an actuator system responsive to a position sensor mounted on the reference frame. At least a portion of the isolator may have the same refractive index as the liquid.

19 Claims, 2 Drawing Sheets

U.S. PATENT DOCUMENTS

| | | |
|---|---|---|
| 2002/0020821 A1 | 2/2002 | Van Santen et al. ......... 250/492 |
| 2002/0163629 A1 | 11/2002 | Switkes et al. ............... 355/53 |
| 2003/0123040 A1 | 7/2003 | Almogy ....................... 355/69 |
| 2003/0174408 A1 | 9/2003 | Rostalski et al. ........... 359/642 |
| 2004/0000627 A1 | 1/2004 | Schuster |
| 2004/0021844 A1 | 2/2004 | Suenaga |
| 2004/0075895 A1 | 4/2004 | Lin ............................ 359/380 |
| 2004/0109237 A1 | 6/2004 | Epple et al. |
| 2004/0119954 A1 | 6/2004 | Kawashima et al. .......... 355/30 |
| 2004/0125351 A1 | 7/2004 | Krautschik ................... 355/53 |

FOREIGN PATENT DOCUMENTS

| | | |
|---|---|---|
| DE | 221 563 | 4/1985 |
| DE | 224448 | 7/1985 |
| DE | 242880 | 2/1987 |
| EP | 0023231 | 2/1981 |
| EP | 0418427 | 3/1991 |
| EP | 0 605 103 A1 | 7/1994 |
| EP | 1039511 | 9/2000 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| WO | WO 99/49504 | 9/1999 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |

OTHER PUBLICATIONS

M. Switkes et al., "Immersion Lithography at 157 nm", MIT Lincoln Lab. Orlando 2001-1, Dec. 17, 2001.

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths To Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future Fab International, vol. 15, Jul. 11, 2003.

H. Kawata et al., "Fabrication of 0.2μm Fine Patterns Using Optical Projection Lithography with an Oil Immersion Lens", Jpn. J. Appl. Phys. vol. 31 (1992), pp. 4174-4177.

G. Owen et al., "1/8μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $K_3$ coefficient in nonparaxial λ/NA scaling equations for resolution, depth of focus, and immersion lithography, *J. Microlith., Microfab., Microsyst.* 1(1):7-12(2002).

LITHOGRAPHIC APPARATUS AND DEVICE MANUFACTURING METHOD

This application is a continuation of U.S. patent application Ser. No. 10/715,116, filed Nov. 18, 2003, now U.S. Pat. No. 7,009,682, and claims priority from European patent application EP 02257938.7, filed Nov. 18, 2002, both applications herein incorporated in their entirety by reference.

FIELD

The present invention relates to immersion lithography.

BACKGROUND

The term "patterning device" as here employed should be broadly interpreted as referring to any device that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such a patterning device include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning device can comprise one or more programmable mirror arrays. More information on mirror arrays as here referred to can be gleaned, for example, from United States patents U.S. Pat. No. 5,296,891 and U.S. Pat. No. 5,523,193, and PCT patent applications WO 98/38597 and WO 98/33096, which are incorporated herein by reference. In the case of a programmable mirror array, the said support structure may be embodied as a frame or table, for example, which may be fixed or movable as required.

A programmable LCD array. An example of such a construction is given in United States Patent U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at one time; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from United States patent U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in Unites States patent U.S. Pat. No. 5,969,441 and PCT patent application WO 98/40791, incorporated herein by reference.

It has been proposed to immerse the substrate in a lithographic projection apparatus in a liquid having a relatively high refractive index, e.g. water, so as to fill a space between the final element of the projection lens and the substrate. The point of this is to enable imaging of smaller features since the exposure radiation will have a shorter wavelength in the liquid. (The effect of the liquid may also be regarded as increasing the effective NA of the system.)

SUMMARY

When a substrate table is moved, e.g., in a scanning exposure, in the liquid, the viscosity of the liquid means that a force will be exerted on the projection system and hence to a reference frame to which some or all position sensors in the apparatus may be attached. To allow accurate positioning of the substrate and mask stages, the reference frame must provide an extremely rigid and stable reference for the different sensors mounted on it. The force exerted on it via the liquid will distort the reference frame sufficiently to invalidate the different position measurements based upon it.

Accordingly, it may be advantageous to provide, for example, a lithographic projection apparatus in which a space between the substrate and projection system is filled with a liquid yet the reference frame is effectively isolated from disturbances caused by movement of the substrate stage.

According to an aspect, there is provided a lithographic projection apparatus comprising:

a support configured to hold a patterning device, the patterning device configured to pattern a beam of radiation according to a desired pattern;

a substrate table configured to hold a substrate;

a projection system configured to project the patterned beam onto a target portion of the substrate;

a liquid supply system configured to at least partly fill a space between said projection system and said substrate, with a liquid through which said beam is to be projected; and an isolator, having at least a portion to allow passage of said beam therethrough, provided between said projection system and said substrate table and mechanically isolated from said projection system.

The isolator between the projection system and the substrate table isolates the projection system from the substrate table and prevents the transmission of forces through the liquid to the projection system and hence to the reference frame. Movements of the substrate table therefore do not disturb the reference frame and the sensors mounted on it. In an embodiment, the isolator comprises a transparent plate.

In an embodiment, a portion of the isolator has a refractive index at the wavelength of the beam substantially the same as the refractive index of the liquid at that wavelength. In this way, the isolator does not introduce any unwanted optical effects.

In an embodiment, the isolator is so shaped and positioned that liquid is divided into two parts, one part between the projection system and the isolator and the other part between the isolator and the substrate table, and with no liquid communication between the two parts. With this arrangement, complete isolation between the substrate table and projection system may be assured.

In an embodiment, there is provided a device configured to maintain said isolator substantially stationary relative to said projection system. The device configured to maintain the isolator stationary may comprise an actuator system which may comprise a position sensor configured to measure the position of the isolator relative to the projection system and an actuator, coupled to said position sensor, configured to maintain said isolator at a predetermined position relative to said projection system. In an embodiment, the position sensor is mounted on the reference frame and the actuator is mounted on a base frame from which the reference frame is mechanically isolated. The actuator may also be responsive to positioning instructions provided to the positioning system for the substrate table to provide a feed-forward control in addition to or instead of feedback control via the position sensor.

According to an aspect, there is provided a device manufacturing method comprising:

providing a liquid to at least partly fill a space between a substrate and a projection system; and projecting a patterned beam of radiation, through an isolator mechanically isolated from said projection system between said substrate and said projection system and through said liquid, onto a target portion of the substrate.

In an embodiment, said method comprises maintaining said isolator substantially stationary relative to said projection system.

Although specific reference may be made in this text to the use of the apparatus described herein in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm).

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Figure 1:
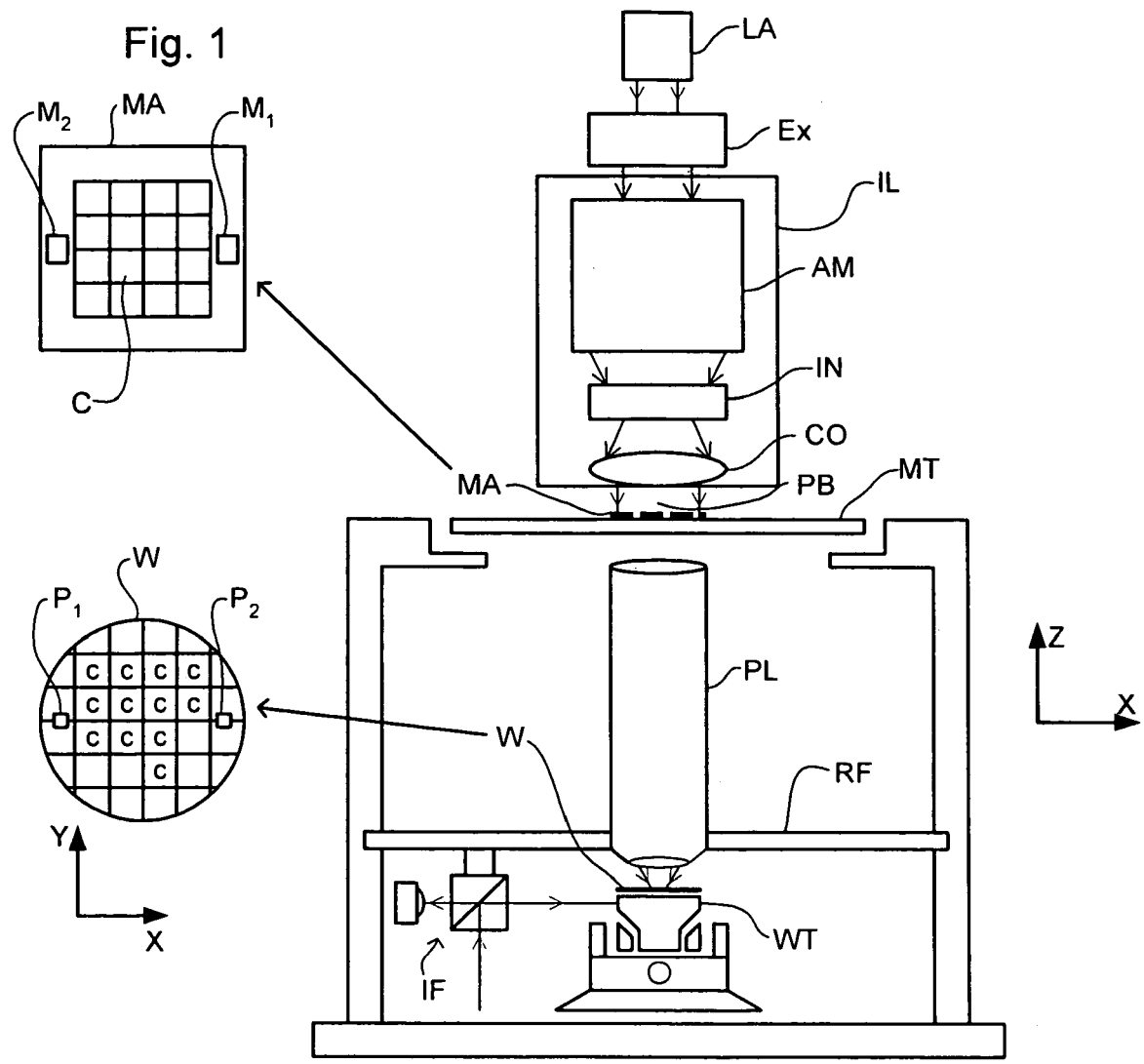
FIG. 1 depicts a lithographic projection apparatus according to an embodiments of the invention.

FIG. 1 schematically depicts a lithographic projection apparatus according to a particular embodiment of the invention. The apparatus comprises:

a radiation system Ex, IL, for supplying a projection beam PB of radiation (e.g. DUV radiation), which in this particular case also comprises a radiation source LA;

a first object table (mask table) MT provided with a mask holder for holding a mask MA (e.g. a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g. a refractive lens system) for imaging an irridiated portion of the mask MA onto a target portion C (e.g. comprising one or more dies) of the substrate W.

As here depicted, the apparatus is of a transmissive type (e.g. has a transmissive mask). However, in general, it may also be of a reflective type, for example (e.g. with a reflective mask). Alternatively, the apparatus may employ another kind of patterning device, such as a programmable mirror array of a type as referred to above.

The source LA (e.g. an excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

In step mode, the mask table MT is kept essentially stationary, and an entire mask image is projected at one time (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
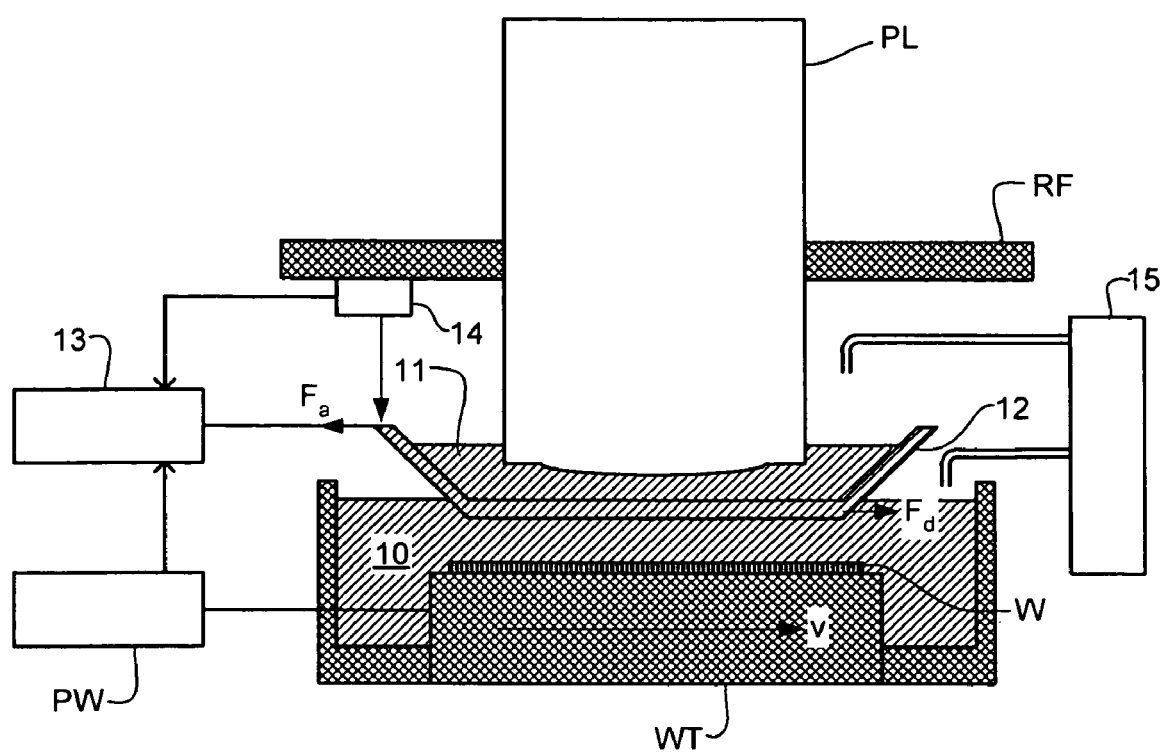
FIG. 2 depicts the substrate table immersion and projection lens isolation arrangements according to an embodiment of the invention.

FIG. 2 shows a substrate stage according to an embodiment in greater detail. The substrate table WT is immersed in a liquid 10 having a relatively high refractive index, e.g. water, provided by liquid supply system 15. The liquid has the effect that the radiation of the projection beam has a shorter wavelength in the liquid than in air or a vacuum, allowing smaller features to be resolved. It is well known that the resolution limit of a projection system is determined, inter alia, by the wavelength of the projection beam and the numerical aperture of the system. The presence of the liquid may also be regarded as increasing the effective numerical aperture.

A transparent plate, or dish, 12 is positioned between the projection system PL and the substrate table WT and also filled with liquid 11, in an embodiment the same liquid as liquid 10. Thus, an entire space between the projection system PL and the substrate W is filled with liquid but the liquid 11 between the plate 12 and the projection system PL is separate from the liquid 10 between the plate 12 and the substrate W. In an embodiment, no liquid need be provided between the plate 12 and the projection system PL.

In an embodiment, the transparent plate 12 has the same refractive index as the liquid 10, 11 at least at the wavelength of the projection beam and any sensor beams, e.g. of through-the lens alignment systems, that may pass through the plate. This avoids optical side-effects, which otherwise would need to be characterized and compensated for. Of course the whole plate need not be transparent, only those parts through which a beam must pass.

The substrate table WT is moved, e.g., in the direction indicated by arrow v, by second positioning means PW, e.g., to perform a scanning exposure. The movement of the substrate table causes currents in the liquid 10 which in turn will exert forces on the plate 12. To prevent the forces being further propagated to the projection system PL and reference frame RF, the transparent plate 12 is maintained stationary relative to the projection lens PL by an actuator system. Since the plate 12 is stationary there is no disturbance of the liquid 11 and hence no force transference to the projection system PL.

The actuator system for maintaining the plate 12 stationary comprises actuators 13 which are controlled in a feedback loop in response to the position of the plate 12 as measured by position sensor 14 mounted on the reference frame RF and/or in a feed-forward loop based on positioning instructions sent to the second positioning means PW. The control system for the actuator system can implement anti noise measures. Interferometers, capacitive sensors, and encoders may be used as the position sensors and Lorentz motors or voice coil motors as the actuators.

The use of actuators rather than a stiff connection to the bath in which the substrate table WT is immersed can facilitate easy removal of the substrates from the substrate table WT after imaging without unduly increasing the volume of liquid in the bath.

It will be appreciated that the force $F_d$ exerted on the plate 12 is not necessarily parallel to or linearly related to the motion v of the substrate table WT, because of turbulence and delays in the transmission of force through the liquid 10. This may limit the usefulness of feed-forward control. Nevertheless, it is important that the force $F_a$ exerted on the plate 12 counters the force $F_d$ transmitted through the liquid 10 sufficiently that disturbances in the liquid 11 are kept low enough that the forces transferred to the projection lens are within acceptable limits.

It should be noted that in some circumstances, e.g., if the substrate table movements are relatively slow and the viscosity of the liquid low, it may not be necessary to use an actuator system to maintain the plate 12 stationary, instead it may be fixed, e.g., to the base frame or another stationary part of the apparatus isolated from the reference frame.

As used herein, an isolator is any structure, including without limitation the plate or dish described above, that limits or prevents transmittance of vibrations or forces through liquid, between the projection system and the substrate table, to the projection system. The vibrations or forces referred to above may include vibrations or forces caused by the movement of liquid between the projection system and the substrate table, whether such movement is due to a flow caused by a liquid supply system or by movement of the substrate table. The vibrations or forces referred to above may also or alternatively include vibrations or forces induced into liquid, between the projection system and the substrate table, from the substrate table or other structure in contact with the liquid.

While specific embodiments of the invention have been described above, it will be appreciated that the invention may be practiced otherwise than as described. The description is not intended to limit the invention.

The invention claimed is:

1. A lithographic projection apparatus, comprising:
    a support structure for supporting patterning means, the patterning means configured to pattern the projection beam according to a desired pattern;
    a substrate table for holding a substrate;
    a projection system for projecting the patterned beam onto a target portion of the substrate;
    an isolator having at least a portion to allow passage of the beam therethrough, provided between the projection system and the substrate table and mechanically isolated from the projection system to limit or prevent transmittance of vibration or forces through a liquid to the projection system; and
    a liquid confinement system for holding a liquid in a space between the isolator and the substrate table.

2. The apparatus according to claim 1, wherein the apparatus is configured to completely cover the substrate with liquid.

3. The apparatus according to claim 1, further comprising an actuator system configured to maintain the isolator substantially stationary relative to the projection system.

4. The apparatus according to claim 3, wherein the actuator system is configured to exert a force substantially parallel to a surface of the substrate.

5. The apparatus according to claim 1, wherein the isolator is connected to a base frame of the apparatus.

6. The apparatus according to claim 5, wherein the projection system is connected to a reference frame which is isolated from the base frame.

7. The apparatus according to claim 1, wherein the isolator comprises a transparent plate.

8. The apparatus according to claim 1, wherein the isolator is so shaped and positioned that a first liquid part is maintained between the projection system and the isolator and a second liquid part is maintained between the isolator and the substrate table, and with no liquid communication between the first and second liquid parts.

9. A device manufacturing method, comprising:
    holding a liquid in a space between an isolator disposed between a substrate table and a projection system, the isolator mechanically isolated from the projection system to limit or prevent transmittance of vibrations or forces through the liquid to the projection system; and
    projecting a patterned beam of radiation through the liquid onto a target portion of a substrate on the substrate table.

10. The method according to claim 9, wherein the substrate is completely covered with liquid.

11. The method according to claim 9, further comprising maintaining the isolator substantially stationary relative to the projection system.

12. The method according to claim 11, comprising exerting a force substantially parallel to a surface of the substrate.

13. The method according to claim 9, wherein the isolator is connected to a base frame of a lithographic apparatus.

14. The method according to claim 13, wherein the projection system is connected to a reference frame which is isolated from the base frame.

15. The method according to claim 9, wherein the isolator comprises a transparent plate.

16. The method according to claim 9, wherein the isolator is so shaped and positioned that a first liquid part is maintained between the projection system and the isolator and a second liquid part is maintained between the isolator and the substrate table, and with no liquid communication between the first and second liquid parts.

17. A lithographic projection apparatus, comprising:
    a substrate table configured to hold a substrate;
    a projection system configured to project a patterned beam onto a target portion of the substrate;
    an isolator having at least a portion to allow passage of the beam therethrough, provided between the projection system and the substrate table and mechanically isolated from the projection system to limit or prevent transmittance of vibration or forces through the liquid to the projection system; and
    a liquid confinement system configured to hold a liquid in a space between the isolator and the substrate table.

18. The apparatus according to claim 17, further comprising an actuator system configured to maintain the isolator substantially stationary relative to the projection system.

19. The apparatus according to claim 18, wherein the actuator system is configured to exert a force substantially parallel to a surface of the substrate.

* * * * *